(12) United States Patent
Sekimoto

(10) Patent No.: US 7,209,063 B2
(45) Date of Patent: Apr. 24, 2007

(54) SEMICONDUCTOR INTEGRATED CIRCUIT HAVING SWITCH CIRCUIT OF DIGITAL SIGNAL

(75) Inventor: Uichi Sekimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/269,747

(22) Filed: Nov. 9, 2005

(65) Prior Publication Data

US 2007/0057824 A1    Mar. 15, 2007

(30) Foreign Application Priority Data

Aug. 23, 2005    (JP)    ............... 2005-241656

(51) Int. Cl.
*H03M 1/66*    (2006.01)
(52) U.S. Cl. ............... 341/144; 341/141; 341/143
(58) Field of Classification Search ......... 341/143–144
See application file for complete search history.

(56) References Cited

U.S. PATENT DOCUMENTS 5,404,142 A * 4/1995 Adams et al. ............... 341/144
5,406,283 A * 4/1995 Leung ........................ 341/143
6,344,812 B1 * 2/2002 Takeda et al. ............... 341/143
6,535,155 B2 * 3/2003 Ruha et al. .................. 341/144
6,614,377 B1 * 9/2003 Adams et al. ............... 341/144
6,819,276 B1 * 11/2004 Hossack ...................... 341/143

FOREIGN PATENT DOCUMENTS

JP    2000-349641    12/2000
JP    2003-168977    6/2003

* cited by examiner

*Primary Examiner*—Khai M. Nguyen
(74) *Attorney, Agent, or Firm*—Arent Fox LLP

(57) ABSTRACT

A switch circuit shifts a bit number of a digital input signal sequentially according to a selection signal and outputs the shifted digital signal as a digital output signal. A switch control circuit receives a shift signal which changes to a random value, performs an operation on the bit number and a value indicated by the shift signal to generate a next bit number, and outputs the generated bit number as the selection signal. Since a random bit number is generated by the switch control circuit, the switch circuit can shift the bit number of the digital input signal in nonregular, random order and output the shifted digital signal as the digital output signal. By supplying the digital output signal to a D/A conversion part, D/A conversion accuracy can be improved.

13 Claims, 22 Drawing Sheets

| SCLK | 1 | 2 | 3 | 4 | 5 | 6 | 7 | 8 | 9 | 10 | 11 | 12 |
|---|---|---|---|---|---|---|---|---|---|---|---|---|
| OUT11 | IN11 | IN11 | IN11 | IN11 | IN11 | IN11 | IN11 | IN11 | IN11 | IN11 | IN11 | IN11 |
| OUT10 | IN10 | IN10 | IN10 | IN10 | IN10 | IN10 | IN10 | IN10 | IN10 | IN10 | IN10 | IN10 |
| OUT9 | IN9 | IN9 | IN9 | IN9 | IN9 | IN9 | IN9 | IN9 | IN9 | IN9 | IN9 | IN9 |
| OUT8 | IN8 | IN8 | IN8 | IN8 | IN8 | IN8 | IN8 | IN8 | IN8 | IN8 | IN8 | IN8 |
| OUT7 | IN7 | IN7 | IN7 | IN7 | IN7 | IN7 | IN7 | IN7 | IN7 | IN7 | IN7 | IN7 |
| OUT6 | IN6 | IN6 | IN6 | IN6 | IN6 | IN6 | IN6 | IN6 | IN6 | IN6 | IN6 | IN6 |
| OUT5 | IN5 | IN5 | IN5 | IN5 | IN5 | IN5 | IN5 | IN5 | IN5 | IN5 | IN5 | IN5 |
| OUT4 | IN4 | IN4 | IN4 | IN4 | IN4 | IN4 | IN4 | IN4 | IN4 | IN4 | IN4 | IN4 |
| OUT3 | IN3 | IN3 | IN3 | IN3 | IN3 | IN3 | IN3 | IN3 | IN3 | IN3 | IN3 | IN3 |
| OUT2 | IN2 | IN2 | IN2 | IN2 | IN2 | IN2 | IN2 | IN2 | IN2 | IN2 | IN2 | IN2 |
| OUT1 | IN1 | IN1 | IN1 | IN1 | IN1 | IN1 | IN1 | IN1 | IN1 | IN1 | IN1 | IN1 |
| OUT0 | IN0 | IN0 | IN0 | IN0 | IN0 | IN0 | IN0 | IN0 | IN0 | IN0 | IN0 | IN0 |

SFT3-0 = "0000", BIT3-0 = "1011"

Fig. 9

| SCLK | 1 | 2 | 3 | 4 | 5 | 6 | 7 | 8 | 9 | 10 | 11 | 12 |
|---|---|---|---|---|---|---|---|---|---|---|---|---|
| OUT11 | IN11 | IN10 | IN9 | IN8 | IN7 | IN6 | IN5 | IN4 | IN3 | IN2 | IN1 | IN0 |
| OUT10 | IN10 | IN9 | IN8 | IN7 | IN6 | IN5 | IN4 | IN3 | IN2 | IN1 | IN0 | IN11 |
| OUT9 | IN9 | IN8 | IN7 | IN6 | IN5 | IN4 | IN3 | IN2 | IN1 | IN0 | IN11 | IN10 |
| OUT8 | IN8 | IN7 | IN6 | IN5 | IN4 | IN3 | IN2 | IN1 | IN0 | IN11 | IN10 | IN9 |
| OUT7 | IN7 | IN6 | IN5 | IN4 | IN3 | IN2 | IN1 | IN0 | IN11 | IN10 | IN9 | IN8 |
| OUT6 | IN6 | IN5 | IN4 | IN3 | IN2 | IN1 | IN0 | IN11 | IN10 | IN9 | IN8 | IN7 |
| OUT5 | IN5 | IN4 | IN3 | IN2 | IN1 | IN0 | IN11 | IN10 | IN9 | IN8 | IN7 | IN6 |
| OUT4 | IN4 | IN3 | IN2 | IN1 | IN0 | IN11 | IN10 | IN9 | IN8 | IN7 | IN6 | IN5 |
| OUT3 | IN3 | IN2 | IN1 | IN0 | IN11 | IN10 | IN9 | IN8 | IN7 | IN6 | IN5 | IN4 |
| OUT2 | IN2 | IN1 | IN0 | IN11 | IN10 | IN9 | IN8 | IN7 | IN6 | IN5 | IN4 | IN3 |
| OUT1 | IN1 | IN0 | IN11 | IN10 | IN9 | IN8 | IN7 | IN6 | IN5 | IN4 | IN3 | IN2 |
| OUT0 | IN0 | IN11 | IN10 | IN9 | IN8 | IN7 | IN6 | IN5 | IN4 | IN3 | IN2 | IN1 |

SFT3- 0 = "0001", BIT3- 0 = "1011"

Fig. 10

| SCLK | 1 | 2 | 3 | 4 | 5 | 6 | 7  | 8 | 9 | 10 | 11 | 12 |
|---|---|---|---|---|---|---|---|---|---|---|---|---|
| OUT11 | IN11 | IN9 | IN7 | IN5 | IN3 | IN1 | IN10 | IN8 | IN6 | IN4 | IN2 | IN0 |
| OUT10 | IN10 | IN8 | IN6 | IN4 | IN2 | IN0 | IN9 | IN7 | IN5 | IN3 | IN1 | IN11 |
| OUT9 | IN9 | IN7 | IN5 | IN3 | IN1 | IN11 | IN8 | IN6 | IN4 | IN2 | IN0 | IN10 |
| OUT8 | IN8 | IN6 | IN4 | IN2 | IN0 | IN10 | IN7 | IN5 | IN3 | IN1 | IN11 | IN9 |
| OUT7 | IN7 | IN5 | IN3 | IN1 | IN11 | IN9 | IN6 | IN4 | IN2 | IN0 | IN10 | IN8 |
| OUT6 | IN6 | IN4 | IN2 | IN0 | IN10 | IN8 | IN5 | IN3 | IN1 | IN11 | IN9 | IN7 |
| OUT5 | IN5 | IN3 | IN1 | IN11 | IN9 | IN7 | IN4 | IN2 | IN0 | IN10 | IN8 | IN6 |
| OUT4 | IN4 | IN2 | IN0 | IN10 | IN8 | IN6 | IN3 | IN1 | IN11 | IN9 | IN7 | IN5 |
| OUT3 | IN3 | IN1 | IN11 | IN9 | IN7 | IN5 | IN2 | IN0 | IN10 | IN8 | IN6 | IN4 |
| OUT2 | IN2 | IN0 | IN10 | IN8 | IN6 | IN4 | IN1 | IN11 | IN9 | IN7 | IN5 | IN3 |
| OUT1 | IN1 | IN11 | IN9 | IN7 | IN5 | IN3 | IN0 | IN10 | IN8 | IN6 | IN4 | IN2 |
| OUT0 | IN0 | IN10 | IN8 | IN6 | IN4 | IN2 | IN11 | IN9 | IN7 | IN5 | IN3 | IN1 |

SFT3-0 = "0010", BIT3-0 = "1011"

Fig. 11

| SCLK | 1 | 2 | 3 | 4 | 5 | 6 | 7 | 8 | 9 | 10 | 11 | 12 |
|---|---|---|---|---|---|---|---|---|---|---|---|---|
| OUT11 | IN11 | IN7 | IN3 | IN10 | IN6 | IN2 | IN9 | IN5 | IN1 | IN8 | IN4 | IN0 |
| OUT10 | IN10 | IN6 | IN2 | IN9 | IN5 | IN1 | IN8 | IN4 | IN0 | IN7 | IN3 | IN11 |
| OUT9 | IN9 | IN5 | IN1 | IN8 | IN4 | IN0 | IN7 | IN3 | IN11 | IN6 | IN2 | IN10 |
| OUT8 | IN8 | IN4 | IN0 | IN7 | IN3 | IN11 | IN6 | IN2 | IN10 | IN5 | IN1 | IN9 |
| OUT7 | IN7 | IN3 | IN11 | IN6 | IN2 | IN10 | IN5 | IN1 | IN9 | IN4 | IN0 | IN8 |
| OUT6 | IN6 | IN2 | IN10 | IN5 | IN1 | IN9 | IN4 | IN0 | IN8 | IN3 | IN11 | IN7 |
| OUT5 | IN5 | IN1 | IN9 | IN4 | IN0 | IN8 | IN3 | IN11 | IN7 | IN2 | IN10 | IN6 |
| OUT4 | IN4 | IN0 | IN8 | IN3 | IN11 | IN7 | IN2 | IN10 | IN6 | IN1 | IN9 | IN5 |
| OUT3 | IN3 | IN11 | IN7 | IN2 | IN10 | IN6 | IN1 | IN9 | IN5 | IN0 | IN8 | IN4 |
| OUT2 | IN2 | IN10 | IN6 | IN1 | IN9 | IN5 | IN0 | IN8 | IN4 | IN11 | IN7 | IN3 |
| OUT1 | IN1 | IN9 | IN5 | IN0 | IN8 | IN4 | IN11 | IN7 | IN3 | IN10 | IN6 | IN2 |
| OUT0 | IN0 | IN8 | IN4 | IN11 | IN7 | IN3 | IN10 | IN6 | IN2 | IN9 | IN5 | IN1 |

SFT3-0 = "0100", BIT3-0 = "1011"

Fig. 13

| SCLK | 1 | 2 | 3 | 4 ⇨ | 5 | 6 ⇨ | 7 | 8 ⇨ | 9 | 10 ⇨ | 11 | 12 ⇨ |
|---|---|---|---|---|---|---|---|---|---|---|---|---|
| OUT11 | IN11 | IN6 | IN1 | IN7 | IN2 | IN8 | IN3 | IN9 | IN4 | IN10 | IN5 | IN0 |
| OUT10 | IN10 | IN5 | IN0 | IN6 | IN1 | IN7 | IN2 | IN8 | IN3 | IN9 | IN4 | IN11 |
| OUT9 | IN9 | IN4 | IN11 | IN5 | IN0 | IN6 | IN1 | IN7 | IN2 | IN8 | IN3 | IN10 |
| OUT8 | IN8 | IN3 | IN10 | IN4 | IN11 | IN5 | IN0 | IN6 | IN1 | IN7 | IN2 | IN9 |
| OUT7 | IN7 | IN2 | IN9 | IN3 | IN10 | IN4 | IN11 | IN5 | IN0 | IN6 | IN1 | IN8 |
| OUT6 | IN6 | IN1 | IN8 | IN2 | IN9 | IN3 | IN10 | IN4 | IN11 | IN5 | IN0 | IN7 |
| OUT5 | IN5 | IN0 | IN7 | IN1 | IN8 | IN2 | IN9 | IN3 | IN10 | IN4 | IN11 | IN6 |
| OUT4 | IN4 | IN11 | IN6 | IN0 | IN7 | IN1 | IN8 | IN2 | IN9 | IN3 | IN10 | IN5 |
| OUT3 | IN3 | IN10 | IN5 | IN11 | IN6 | IN0 | IN7 | IN1 | IN8 | IN2 | IN9 | IN4 |
| OUT2 | IN2 | IN9 | IN4 | IN10 | IN5 | IN11 | IN6 | IN0 | IN7 | IN1 | IN8 | IN3 |
| OUT1 | IN1 | IN8 | IN3 | IN9 | IN4 | IN10 | IN5 | IN11 | IN6 | IN0 | IN7 | IN2 |
| OUT0 | IN0 | IN7 | IN2 | IN8 | IN3 | IN9 | IN4 | IN10 | IN5 | IN11 | IN6 | IN1 |

SFT3-0 = "0101", BIT3-0 = "1011"

Fig. 14

| SCLK | 1 | 2 | 3 | 4 | 5 | 6 | 7 | 8 | 9 | 10 | 11 | 12 |
|---|---|---|---|---|---|---|---|---|---|---|---|---|
| OUT11 | IN11 | IN5 | IN10 | IN4 | IN9 | IN3 | IN8 | IN2 | IN7 | IN1 | IN6 | IN0 |
| OUT10 | IN10 | IN4 | IN9 | IN3 | IN8 | IN2 | IN7 | IN1 | IN6 | IN0 | IN5 | IN11 |
| OUT9 | IN9 | IN3 | IN8 | IN2 | IN7 | IN1 | IN6 | IN0 | IN5 | IN11 | IN4 | IN10 |
| OUT8 | IN8 | IN2 | IN7 | IN1 | IN6 | IN0 | IN5 | IN11 | IN4 | IN10 | IN3 | IN9 |
| OUT7 | IN7 | IN1 | IN6 | IN0 | IN5 | IN11 | IN4 | IN10 | IN3 | IN9 | IN2 | IN8 |
| OUT6 | IN6 | IN0 | IN5 | IN11 | IN4 | IN10 | IN3 | IN9 | IN2 | IN8 | IN1 | IN7 |
| OUT5 | IN5 | IN11 | IN4 | IN10 | IN3 | IN9 | IN2 | IN8 | IN1 | IN7 | IN0 | IN6 |
| OUT4 | IN4 | IN10 | IN3 | IN9 | IN2 | IN8 | IN1 | IN7 | IN0 | IN6 | IN11 | IN5 |
| OUT3 | IN3 | IN9 | IN2 | IN8 | IN1 | IN7 | IN0 | IN6 | IN11 | IN5 | IN10 | IN4 |
| OUT2 | IN2 | IN8 | IN1 | IN7 | IN0 | IN6 | IN11 | IN5 | IN10 | IN4 | IN9 | IN3 |
| OUT1 | IN1 | IN7 | IN0 | IN6 | IN11 | IN5 | IN10 | IN4 | IN9 | IN3 | IN8 | IN2 |
| OUT0 | IN0 | IN6 | IN11 | IN5 | IN10 | IN4 | IN9 | IN3 | IN8 | IN2 | IN7 | IN1 |

SFT3-0 = "0110", BIT3-0 = "1011"

Fig. 15

| SCLK | 1 | 2 | 3 ⇨ | 4 | 5 ⇨ | 6 ⇨ | 7 | 8 ⇨ | 9 ⇨ | 10 | 11 ⇨ | 12 |
|---|---|---|---|---|---|---|---|---|---|---|---|---|
| OUT11 | IN11 | IN4 | IN8 | IN1 | IN5 | IN9 | IN2 | IN6 | IN10 | IN3 | IN7 | IN0 |
| OUT10 | IN10 | IN3 | IN7 | IN0 | IN4 | IN8 | IN1 | IN5 | IN9 | IN2 | IN6 | IN11 |
| OUT9 | IN9 | IN2 | IN6 | IN11 | IN3 | IN7 | IN0 | IN4 | IN8 | IN1 | IN5 | IN10 |
| OUT8 | IN8 | IN1 | IN5 | IN10 | IN2 | IN6 | IN11 | IN3 | IN7 | IN11 | IN4 | IN9 |
| OUT7 | IN7 | IN0 | IN4 | IN9 | IN1 | IN5 | IN10 | IN2 | IN6 | IN10 | IN3 | IN8 |
| OUT6 | IN6 | IN11 | IN3 | IN8 | IN0 | IN4 | IN9 | IN1 | IN5 | IN9 | IN2 | IN7 |
| OUT5 | IN5 | IN10 | IN2 | IN7 | IN11 | IN3 | IN8 | IN0 | IN4 | IN8 | IN1 | IN6 |
| OUT4 | IN4 | IN9 | IN1 | IN6 | IN10 | IN2 | IN7 | IN11 | IN3 | IN7 | IN0 | IN5 |
| OUT3 | IN3 | IN8 | IN0 | IN5 | IN9 | IN1 | IN6 | IN10 | IN2 | IN6 | IN11 | IN4 |
| OUT2 | IN2 | IN7 | IN11 | IN4 | IN8 | IN0 | IN5 | IN9 | IN1 | IN5 | IN10 | IN3 |
| OUT1 | IN1 | IN6 | IN10 | IN3 | IN7 | IN11 | IN4 | IN8 | IN0 | IN4 | IN9 | IN2 |
| OUT0 | IN0 | IN5 | IN9 | IN2 | IN6 | IN10 | IN3 | IN7 | IN11 | IN4 | IN8 | IN1 |

SFT3-0 = "0111", BIT3-0 = "1011"

Fig. 16

| SCLK | 1 | 2 | 3 | 4 | 5 | 6 | 7 | 8 | 9 | 10 | 11 | 12 |
|---|---|---|---|---|---|---|---|---|---|---|---|---|
| OUT11 | IN11 | IN3 | IN6 | IN9 | IN1 | IN4 | IN7 | IN10 | IN2 | IN5 | IN8 | IN0 |
| OUT10 | IN10 | IN2 | IN5 | IN8 | IN0 | IN3 | IN6 | IN9 | IN1 | IN4 | IN7 | IN11 |
| OUT9 | IN9 | IN1 | IN4 | IN7 | IN11 | IN2 | IN5 | IN8 | IN0 | IN3 | IN6 | IN10 |
| OUT8 | IN8 | IN0 | IN3 | IN6 | IN10 | IN1 | IN4 | IN7 | IN11 | IN2 | IN5 | IN9 |
| OUT7 | IN7 | IN11 | IN2 | IN5 | IN9 | IN0 | IN3 | IN6 | IN10 | IN1 | IN4 | IN8 |
| OUT6 | IN6 | IN10 | IN1 | IN4 | IN8 | IN11 | IN2 | IN5 | IN9 | IN0 | IN3 | IN7 |
| OUT5 | IN5 | IN9 | IN0 | IN3 | IN7 | IN10 | IN1 | IN4 | IN8 | IN11 | IN2 | IN6 |
| OUT4 | IN4 | IN8 | IN11 | IN2 | IN6 | IN9 | IN0 | IN3 | IN7 | IN10 | IN1 | IN5 |
| OUT3 | IN3 | IN7 | IN10 | IN1 | IN5 | IN8 | IN11 | IN2 | IN6 | IN9 | IN0 | IN4 |
| OUT2 | IN2 | IN6 | IN9 | IN0 | IN4 | IN7 | IN10 | IN1 | IN5 | IN8 | IN11 | IN3 |
| OUT1 | IN1 | IN5 | IN8 | IN11 | IN3 | IN6 | IN9 | IN0 | IN4 | IN7 | IN10 | IN2 |
| OUT0 | IN0 | IN4 | IN7 | IN10 | IN2 | IN5 | IN8 | IN11 | IN3 | IN6 | IN9 | IN1 |

SFT3-0 = "1000", BIT3-0 = "1011"

Fig. 17

| SCLK | 1 | 2 | 3 | 4 | 5 | 6 | 7 | 8 | 9 | 10 | 11 | 12 |
|---|---|---|---|---|---|---|---|---|---|---|---|---|
| OUT11 | IN11 | IN2 | IN4 | IN6 | IN8 | IN10 | IN1 | IN3 | IN5 | IN7 | IN9 | IN0 |
| OUT10 | IN10 | IN1 | IN3 | IN5 | IN7 | IN9 | IN0 | IN2 | IN4 | IN6 | IN8 | IN11 |
| OUT9 | IN9 | IN0 | IN2 | IN4 | IN6 | IN8 | IN11 | IN1 | IN3 | IN5 | IN7 | IN10 |
| OUT8 | IN8 | IN11 | IN1 | IN3 | IN5 | IN7 | IN10 | IN0 | IN2 | IN4 | IN6 | IN9 |
| OUT7 | IN7 | IN10 | IN0 | IN2 | IN4 | IN6 | IN9 | IN11 | IN1 | IN3 | IN5 | IN8 |
| OUT6 | IN6 | IN9 | IN11 | IN1 | IN3 | IN5 | IN8 | IN10 | IN0 | IN2 | IN4 | IN7 |
| OUT5 | IN5 | IN8 | IN10 | IN0 | IN2 | IN4 | IN7 | IN9 | IN11 | IN1 | IN3 | IN6 |
| OUT4 | IN4 | IN7 | IN9 | IN11 | IN1 | IN3 | IN6 | IN8 | IN10 | IN0 | IN2 | IN5 |
| OUT3 | IN3 | IN6 | IN8 | IN10 | IN0 | IN2 | IN5 | IN7 | IN9 | IN11 | IN1 | IN4 |
| OUT2 | IN2 | IN5 | IN7 | IN9 | IN11 | IN1 | IN4 | IN6 | IN8 | IN10 | IN0 | IN3 |
| OUT1 | IN1 | IN4 | IN6 | IN8 | IN10 | IN0 | IN3 | IN5 | IN7 | IN9 | IN11 | IN2 |
| OUT0 | IN0 | IN3 | IN5 | IN7 | IN9 | IN11 | IN2 | IN4 | IN6 | IN8 | IN10 | IN1 |

SFT3-0 = "1001", BIT3-0 = "1011"

Fig. 18

| SCLK | 1 | 2 | 3 | 4 | 5 | 6 | 7 | 8 | 9 | 10 | 11 | 12 |
|---|---|---|---|---|---|---|---|---|---|---|---|---|
| OUT11 | IN11 | IN1 | IN2 | IN3 | IN4 | IN5 | IN6 | IN7 | IN8 | IN9 | IN10 | IN0 |
| OUT10 | IN10 | IN0 | IN1 | IN2 | IN3 | IN4 | IN5 | IN6 | IN7 | IN8 | IN9 | IN11 |
| OUT9 | IN9 | IN11 | IN0 | IN1 | IN2 | IN3 | IN4 | IN5 | IN6 | IN7 | IN8 | IN10 |
| OUT8 | IN8 | IN10 | IN11 | IN0 | IN1 | IN2 | IN3 | IN4 | IN5 | IN6 | IN7 | IN9 |
| OUT7 | IN7 | IN9 | IN10 | IN11 | IN0 | IN1 | IN2 | IN3 | IN4 | IN5 | IN6 | IN8 |
| OUT6 | IN6 | IN8 | IN9 | IN10 | IN11 | IN0 | IN1 | IN2 | IN3 | IN4 | IN5 | IN7 |
| OUT5 | IN5 | IN7 | IN8 | IN9 | IN10 | IN11 | IN0 | IN1 | IN2 | IN3 | IN4 | IN6 |
| OUT4 | IN4 | IN6 | IN7 | IN8 | IN9 | IN10 | IN11 | IN0 | IN1 | IN2 | IN3 | IN5 |
| OUT3 | IN3 | IN5 | IN6 | IN7 | IN8 | IN9 | IN10 | IN11 | IN0 | IN1 | IN2 | IN4 |
| OUT2 | IN2 | IN4 | IN5 | IN6 | IN7 | IN8 | IN9 | IN10 | IN11 | IN0 | IN1 | IN3 |
| OUT1 | IN1 | IN3 | IN4 | IN5 | IN6 | IN7 | IN8 | IN9 | IN10 | IN11 | IN0 | IN2 |
| OUT0 | IN0 | IN2 | IN3 | IN4 | IN5 | IN6 | IN7 | IN8 | IN9 | IN10 | IN11 | IN1 |

SFT3-0 = "1010", BIT3-0 = "1011"

Fig. 19

| SCLK | 1 | 2 | 3 | ⇨ 4 | ⇨ 5 | 6 | 7 | 8 | ⇨ 9 | ⇨ 10 | ⇨ 11 | 12 |
|---|---|---|---|---|---|---|---|---|---|---|---|---|
| OUT11 | IN11 | IN7 | IN8 | IN9 | IN10 | IN6 | IN11 | IN7 | IN8 | IN9 | IN10 | IN6 |
| OUT10 | IN10 | IN6 | IN7 | IN8 | IN9 | IN5 | IN10 | IN6 | IN7 | IN8 | IN9 | IN5 |
| OUT9 | IN9 | IN5 | IN6 | IN7 | IN8 | IN4 | IN9 | IN5 | IN6 | IN7 | IN8 | IN4 |
| OUT8 | IN8 | IN4 | IN5 | IN6 | IN7 | IN3 | IN8 | IN4 | IN5 | IN6 | IN7 | IN3 |
| OUT7 | IN7 | IN3 | IN4 | IN5 | IN6 | IN2 | IN6 | IN3 | IN4 | IN5 | IN6 | IN2 |
| OUT6 | IN6 | IN2 | IN3 | IN4 | IN5 | IN1 | IN5 | IN2 | IN3 | IN4 | IN5 | IN1 |
| OUT5 | IN5 | IN1 | IN2 | IN3 | IN4 | IN0 | IN4 | IN1 | IN2 | IN3 | IN4 | IN0 |
| OUT4 | IN4 | IN0 | IN1 | IN2 | IN3 | IN11 | IN3 | IN0 | IN1 | IN2 | IN3 | IN11 |
| OUT3 | IN3 | IN11 | IN0 | IN1 | IN2 | IN10 | IN2 | IN11 | IN0 | IN1 | IN2 | IN10 |
| OUT2 | IN2 | IN10 | IN11 | IN0 | IN1 | IN9 | IN1 | IN10 | IN11 | IN0 | IN1 | IN9 |
| OUT1 | IN1 | IN9 | IN10 | IN11 | IN0 | IN8 | IN0 | IN9 | IN10 | IN11 | IN0 | IN8 |
| OUT0 | IN0 | IN8 | IN9 | IN10 | IN11 | IN7 | IN0 | IN8 | IN9 | IN10 | IN11 | IN7 |

SFT3-0 = "0100", BIT3-0 = "0101"

Fig. 20

SEMICONDUCTOR INTEGRATED CIRCUIT HAVING SWITCH CIRCUIT OF DIGITAL SIGNAL

CROSS REFERENCE TO RELATED APPLICATION

This application is based upon and claims the benefit of priority from Japanese Patent Application No. 2005-241656, filed on Aug. 23, 2005, the entire contents of which are incorporated herein by reference.

BACKGROUND OF THE INVENTION

1. Field of the Invention

The present invention relates to a semiconductor integrated circuit which switches a bit number of a digital signal.

2. Description of the Related Art

One of methods for a D/A converter is a dynamic element matching (hereinafter referred to as DEM) method (for example, disclosed in Japanese Unexamined Patent Application Publication No. 2000-168977). In the DEM method, by sequentially switching plural elements such as resistors within a predetermined period of time, dispersions in element characteristics can be suppressed to a minimum. On this occasion, a switch circuit to supply data values to the elements is configured using a barrel shifter or a shift register. Consequently, D/A conversion accuracy can be improved irrespective of relative dispersions in element characteristics. Further, there is a disclosed technique of improving the accuracy of the D/A converter by adding minute resistors in order to adjust resistance values of the resistors for D/A conversion (for example, Japanese Unexamined Patent Application Publication No. 2000-349641).

The above-described DEM D/A converter cancels dispersions in element characteristics by cyclically shifting the data values supplied to the elements according to a predetermined rule by the switch circuit. Namely, the elements for D/A conversion are used cyclically according to a predetermined rule. Consequently, the accuracy of the D/A converter can be improved as compared with methods in which DEM is not used. However, on the other hand, the switch circuit can perform only a cyclic shift operation, so that the accuracy of the D/A converter changes cyclically within a predetermined period of time.

SUMMARY OF THE INVENTION

An object of the present invention is to randomly switch a bit number of a digital signal by a switch circuit. In particular, an object of the present invention is to use elements for D/A conversion randomly by switching the bit number of the digital signal, improving the accuracy of a D/A converter.

In one aspect of the present invention, a switch circuit receives a selection signal indicating a bit number and sequentially shifts a bit number of a plural-bit digital input signal supplied to plural input signal lines according to the selection signal. The shifted digital signal as a plural-bit digital output signal is sequentially outputted to plural output signal lines. A switch control circuit receives a shift signal whose value varies to a random value and generates a next bit number by performing an operation on the bit number and a value indicated by the shift signal. The switch control circuit sequentially outputs the generated bit number as the selection signal. Since the random bit number is generated by the switch control circuit, the switch circuit can shift the bit number of the digital input signal in nonregular, random order and output the shifted digital signal as the digital output signal. Accordingly, a data switching circuit which randomly switches bits of the input signal can be configured.

In a preferable example of the one aspect of the present invention, a random-number control circuit outputs the shift signal corresponding to a random number generated by a random-number generator. Thereby, the random number can be generated without depending on an external system, and the digital output signal whose bit number is shifted in random order can be outputted.

In a preferable example of the one aspect of the present invention, the switch circuit outputs the digital output signal in synchronization with a first clock signal. The random-number generator generates the random number in synchronization with a clock signal whose frequency is lower than that of the first clock signal. Consequently, it is possible to output the digital output signal whose bit number is shifted in random order within a predetermined period in which plural random numbers are generated shifting the bit number of the digital input signal by a predetermined rule.

In a preferable example of the one aspect of the present invention, the switch control circuit sets, according to a bit signal, a range of a number of bits of the digital output signal to which respective bits of the digital input signal are outputted. Namely, each of the bits of the digital input signal is outputted to any of a predetermined number of bits of the digital output signal. This can change the randomness of the digital output signal. For example, by forming, in the semiconductor integrated circuit, a circuit which generates a random bit signal, it is possible to output the digital output signal whose bit number is shifted in more random order.

In a preferable example of the one aspect of the present invention, a first memory unit holds a value of the digital input signal and outputs the holding digital input signal to the switch circuit via the input signal lines. A second memory unit holds a value of the digital output signal outputted from the switch circuit and outputs the holding digital output signal. By the first and second memory units, the timings at which the digital signals are inputted to and outputted from the switch circuit can be set in accordance with the operation of the switch circuit. Consequently, the timing of the switch circuit can be easily designed, and the operating frequency of the switch circuit can be increased.

In a preferable example of the one aspect of the present invention, the switch circuit outputs the digital output signal in synchronization with a first clock signal. The second memory unit holds the digital output signal in synchronization with the first clock signal. The first memory unit receives the digital input signal in synchronization with a second clock signal. For example, by making frequencies of the first and second clock signals the same, one digital output signal can be outputted corresponding to one digital input signal. Alternatively, by making the frequency of the first clock signal higher than the frequency of the second clock signal, plural digital output signals can be outputted corresponding to one digital input signal. Namely, oversampling is made possible.

In a preferable example of the one aspect of the present invention, an D/A conversion part is connected to the output signal lines and converts into an analog signal the digital output signal which is from the switch circuit and transmitted to the output signal lines. The application of the present invention makes it possible to generate the digital output signal whose bit number is shifted in random order, which enables an improvement in D/A conversion accuracy.

In a preferable example of the one aspect of the present invention, the switch circuit includes plural output selection circuits corresponding to respective bits of the digital input signal and plural operational circuits corresponding to respective bits of the digital output signal. Each of the output selection circuits includes plural output signal lines respectively connected to inputs of the operational circuits and output respective bits of the received digital input signal to any of the output signal lines according to the shift signal. The output signal lines to which the output selection circuit outputs the digital output signal are connected to the operational circuits different from each other. The respective operational circuits output an OR logic of the output signal lines as the digital output signal. Thereby, the operational circuit can be composed of a wired-OR logic, which can reduce the circuit scale (number of transistors and so on) of the switch circuit. As a result, the chip size of the semiconductor integrated circuit can be reduced.

In a preferable example of the one aspect of the present invention, when a bit number to generate is outside the bit numbers composing the digital input signal, the switch control circuit generates a next bit number by cycling the bit number and then shifting the bit number by a predetermined value. Not only cycling but also further shifting the bit number makes it possible to reduce the frequency at which the bit numbers overlap. As a result, the digital output signal whose bit number is shifted in more random order can be generated.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 9 is an explanatory diagram showing an operation of the switch circuit;

FIG. 10 is an explanatory diagram showing an operation of the switch circuit;

FIG. 11 is an explanatory diagram showing an operation of the switch circuit;

FIG. 13 is an explanatory diagram showing an operation of the switch circuit;

FIG. 14 is an explanatory diagram showing an operation of the switch circuit;

FIG. 15 is an explanatory diagram showing an operation of the switch circuit;

FIG. 16 is an explanatory diagram showing an operation of the switch circuit;

FIG. 17 is an explanatory diagram showing an operation of the switch circuit;

FIG. 18 is an explanatory diagram showing an operation of the switch circuit;

FIG. 19 is an explanatory diagram showing an operation of the switch circuit;

FIG. 20 is an explanatory diagram showing another operation of the switch circuit;

DESCRIPTION OF THE PREFERRED EMBODIMENTS

Figure 1:
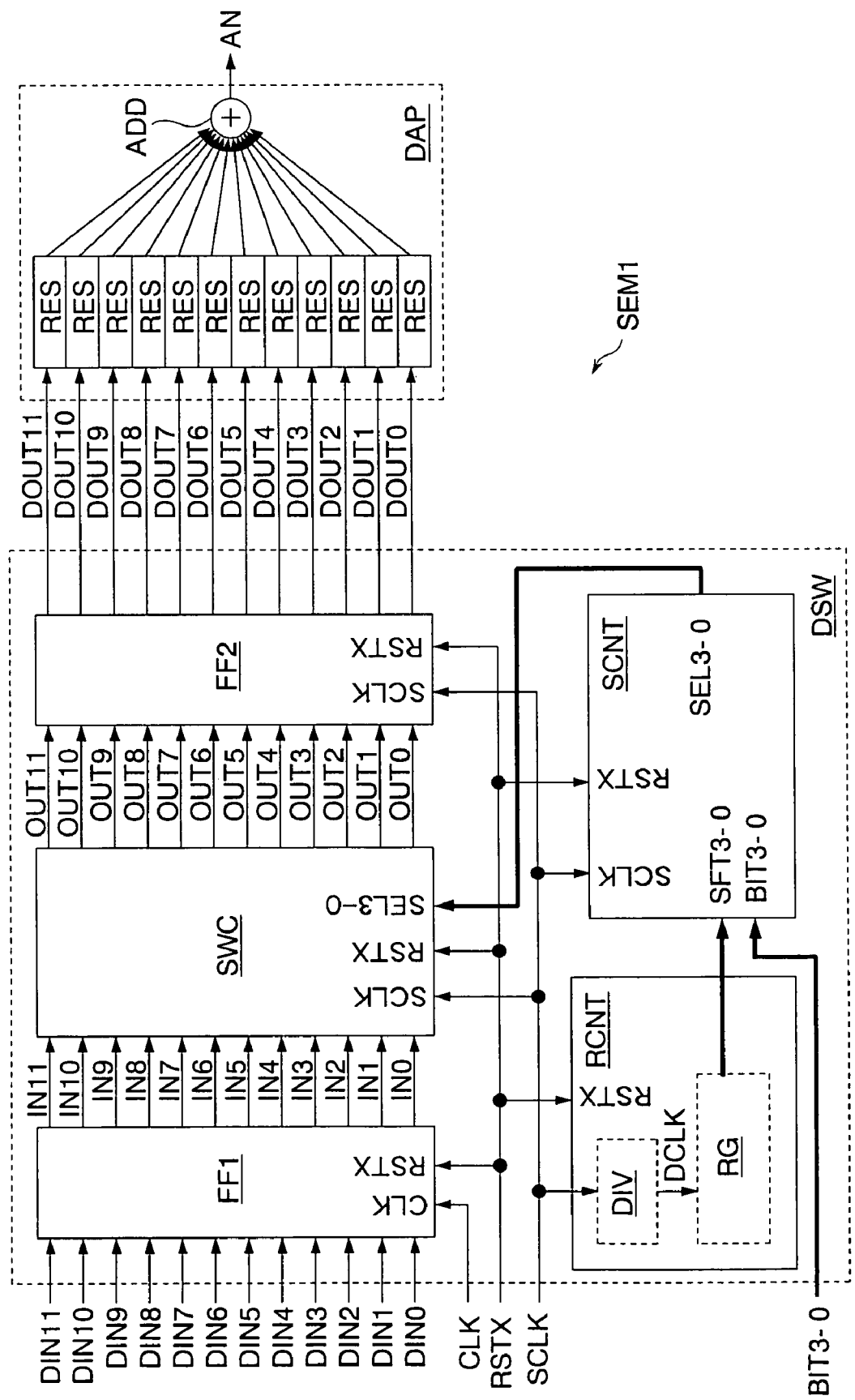
FIG. 1 is a block diagram showing a first embodiment of a semiconductor integrated circuit according to the present invention.

Embodiments of the present invention will be described below using the drawings. In the drawings, signal lines shown by thick lines are each composed of plural lines. Part of blocks to which the thick lines are connected are composed of plural circuits. For the signal lines to which signals are transmitted, the same numerals and symbols as the names of the signals are used.

FIG. 1 shows a first embodiment of a semiconductor integrated circuit of the present invention. A semiconductor integrated circuit SEM1 includes a data switching circuit DSW and a D/A conversion part DAP. For example, the semiconductor integrated circuit SEM1 is formed as a D/A converter by using a CMOS process on a silicon substrate.

The data switching circuit DSW includes a first memory unit FF1, a switch circuit SWC, a second memory unit FF2, a random-number control circuit RCNT, and a switch control circuit SCNT. The first memory unit FF1 includes 12 latches not shown, latches the value of a digital modulated 12-bit digital input signal DIN11-0 in synchronization with a clock signal CLK, and outputs the latched value as a digital input signal IN11-0 to input signal lines. The data value of the digital input signal DIN11-0 is represented, for example, by the number of bits showing a high logic level. The latches of the first memory unit FF1 are reset in synchronization with a reset signal RSTX.

The switch circuit SWC switches respective bits of the digital input signal IN11-0 supplied via the input signal lines according to a selection signal SEL (SEL3-0) and outputs the switched bits as a digital output signal OUT11-0 to output signal lines. In other words, the switch circuit SWC shifts a bit number of the digital input signal IN11-0 according to the selection signal SEL and outputs the shifted digital signal as the digital output signal OUT11-0. The selection signal SEL indicates a shift specification of the bit number of the digital signal as described later. The switch circuit SWC outputs the digital output signal OUT11-0 in synchronization with a system clock signal SCLK. In this example, the system clock signal SCLK has the same frequency and phase as the clock signal CLK. Internal circuits composing the switch circuit SWC are reset in synchronization with the reset signal RSTX.

The second memory unit FF2 includes 12 latches not shown, latches the value of the 12-bit digital output signal OUT11-0 in synchronization with the system clock signal SCLK, and outputs the latched value as a digital output signal DOUT11-0. The latches of the second memory unit FF2 are reset in synchronization with the reset signal RSTX. By synchronizing timings of the digital signals IN and OUT inputted to and outputted from the switch circuit SWC to the clock signals CLK and SCLK by the first and second memory units FF1 and FF2, the timing of the switch circuit SWC can be easily designed, and the operating frequency of the switch circuit SWC can be increased.

The random-number control circuit RCNT includes a frequency divider DIV which divides the frequency of the system clock signal SCLK and generates a divided clock signal DCLK and a random-number generator RG which generates a 4-bit random shift signal SFT3-0 in synchronization with the divided clock signal DCLK. In this embodiment, the random-number generator RG generates a random number and outputs the shift signal SFT indicating the generated random number every 12 pulses of the system clock signal SCLK (12 clock cycles). Consequently, as described later, it becomes possible to output the digital output signal OUT whose bit number is shifted while the value of the selection signal SEL3-0 is updated with the value indicated by the shift signal SFT as the value of increase within 12 clock cycles, and it becomes possible to output the digital output signal OUT whose bit number is shifted in random order within a predetermined period longer than 12 clock cycles.

The switch control circuit SCNT receives the shift signal SFT and sequentially adds the value indicated by the shift signal SFT to a later-described bit number of the digital input signal IN in response to each system clock signal SCLK. The switch control circuit SCNT sequentially outputs the bit number after addition as the 4-bit selection signal SEL3-0 in synchronization with the system clock signal SCLK. Namely, the selection signal SEL3-0 which sequentially increases is outputted every clock cycle of the system clock signal SCLK. When the value of the selection signal SEL3-0 overflows, the selection signal SEL3-0 is cycled.

The range of values of the selection signal SEL3-0 generated by the switch control circuit SCNT is determined according to a 4-bit bit signal BIT3-0. For example, when the bit signal BIT3-0 indicates "11" in decimal, the selection signal SEL3-0 indicating "0" to "11" in decimal is generated. When the bit signal BIT3-0 indicates "5" in decimal, the selection signal SEL3-0 indicating "0" to "5" in decimal is generated. This also applies to the bit signal BIT3-0 having other values. Internal circuits composing the switch control circuit SCNT are reset in synchronization with the reset signal RSTX. An explanation of an operation of the switch control circuit SCNT will be given in later-described FIG. 2.

The D/A conversion part DAP includes 12 resistor elements RES and an adder ADD. One ends of the resistor elements RES are respectively connected to the output signal lines OUT11-0 via the second memory unit FF2, and receive bits of the digital output signal DOUT11-0 (high logic level or low logic level). The adder ADD is connected to the other ends of the resistor elements RES, adds currents supplied via the resistor elements RES, and generates an analog voltage AN (analog signal) according to the added currents.

Resistance values of the resistor elements RES are ideally equal, but slightly different relatively according to a semiconductor fabricating condition (exposure condition, etching condition, or the like). To completely cancel dispersions in resistance values within a predetermined period of time, in the present invention, the bit number of the digital input signal DIN11-0 is switched randomly by the switch circuit SWC and outputted as the digital output signal DOUT11-0. Consequently, D/A conversion accuracy can be improved.

Figure 2:
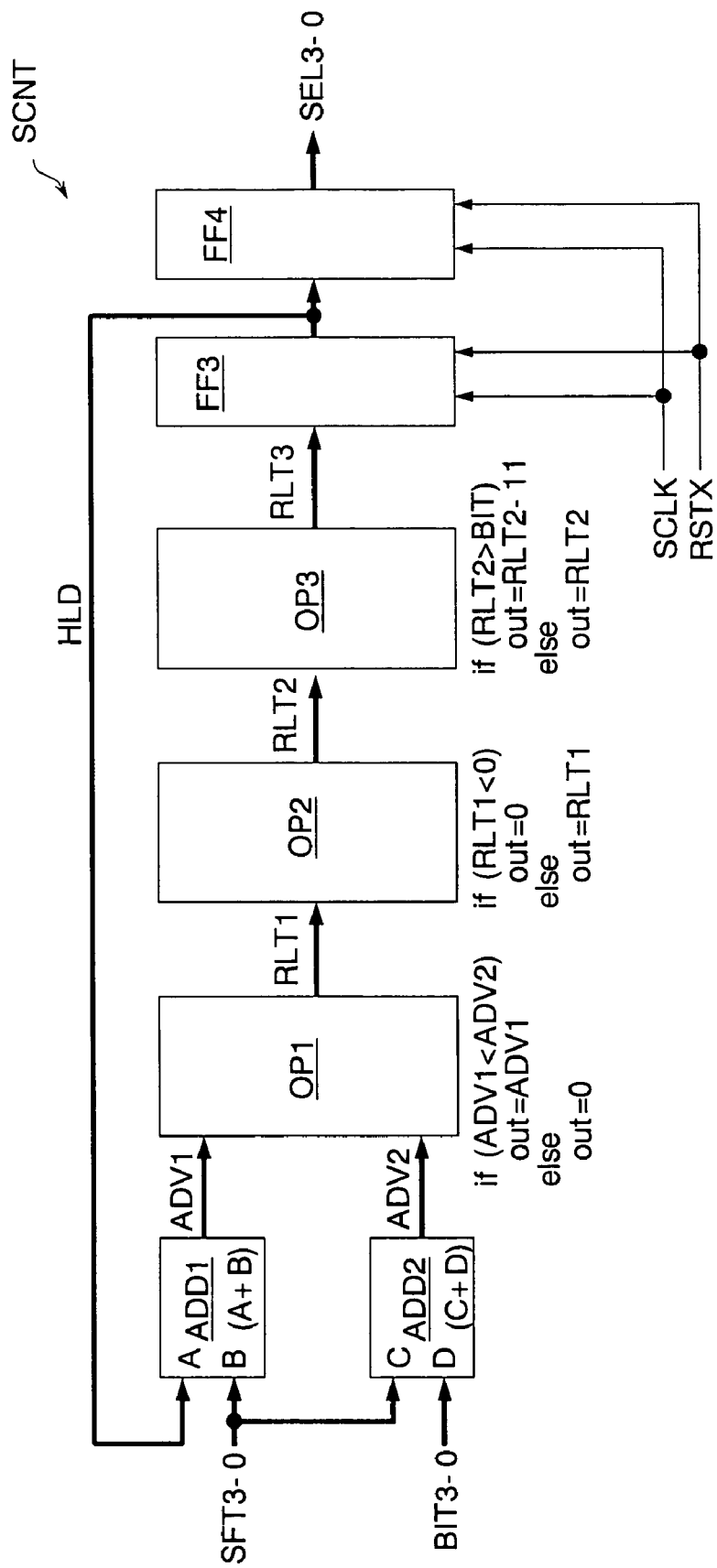
FIG. 2 is a block diagram showing details of a switch control circuit shown in FIG. 1.

FIG. 2 shows details of the switch control circuit SCNT shown in FIG. 1. The switch control circuit SCNT includes additional parts ADD1 and ADD2, operational parts OP1, OP2, and OP3, and latch parts FF3 and FF4.

The additional part ADD1 adds the shift signal SFT3-0 (4-bit binary number) and a hold data signal HLD (5-bit binary number) received by input terminals A and B and outputs an additional result as an additional data signal (additional value) ADV1 (5-bit binary number, for example). The additional part ADD2 adds the shift signal SFT3-0 and the bit signal BIT3-0 received by input terminals C and D, respectively, and outputs an additional result as an additional data signal (additional value) ADV2 (5-bit binary number, for example).

If the additional value ADV1 is less than the additional value ADV2, the operational part OP1 outputs the additional value ADV1 as an additional result signal RLT1 (5-bit binary number, for example). If the additional value ADV1 is equal to or more than the additional value ADV2, the operational part OP1 outputs an initial value "0" as the additional result signal RLT1. The operational part OP1 prevents the additional value ADV1 from being equal to or more than the additional value ADV2. This can prevent the operational part OP3 from malfunctioning. Namely, this can prevent the selection signal SEL3-0 from being set to a value exceeding "11 (in decimal)".

If the value of the additional result signal RLT1 is negative, the operational part OP2 outputs the initial value "0" as an additional result signal RLT2 (5-bit binary number, for example). If the additional result signal RLT1 is equal to or more than "0", the operational part OP2 outputs the additional result signal RLT1 as the additional result signal RLT2.

If the value of the additional result signal RLT2 is more than the value of the bit signal BIT3-0, the operational part OP3 outputs a value obtained by subtracting a logic value "11 (in decimal)" from the additional result signal RLT2 as an additional result signal RLT3 (5-bit binary number, for example). If the additional result signal RLT2 is equal to or less than the value of the bit signal BIT3-0, the operational part OP3 outputs the additional result signal RLT2 as the additional result signal RLT3. The upper limit of the value of the selection signal SEL3-0 can be set to the value of the bit signal BIT3-0 by the operational part OP3.

The latch part FF3 latches the additional result signal RLT3 in synchronization with the system clock signal SCLK and outputs the latched value as the hold data signal HLD. The latch part FF4 latches the hold data signal HLD in synchronization with the system clock signal SCLK and outputs the latched value as the selection signal SEL3-0. The latch parts FF3 and FF4 are reset to "0" in synchronization with the reset signal RSTX.

Figure 3:
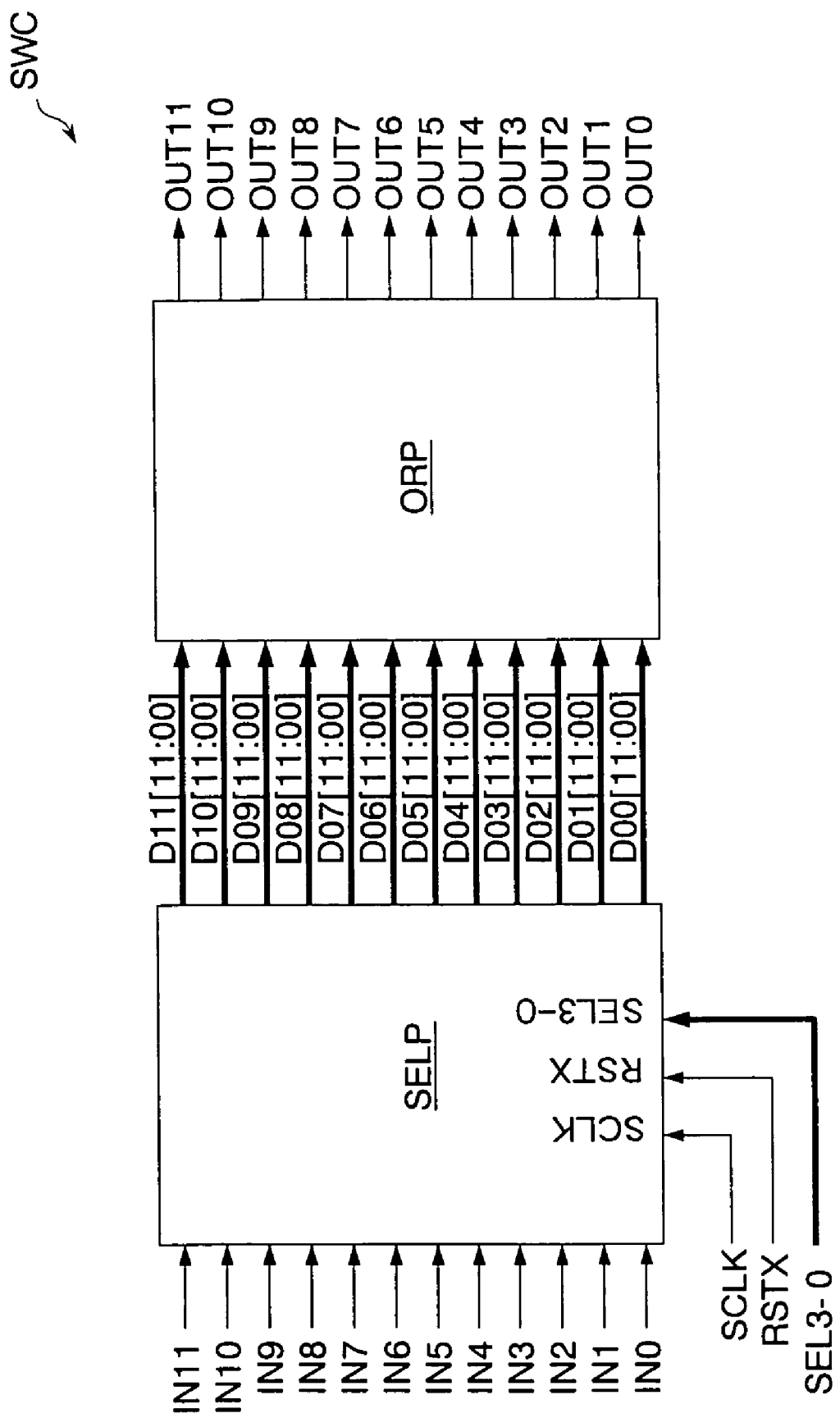
FIG. 3 is a block diagram showing details of a switch circuit shown in FIG. 1.

FIG. 3 shows details of the switch circuit SWC shown in FIG. 1. The switch circuit SWC includes a selection part SELP and an OR operational part ORP. The selection part SELP shifts the bit number of the input signal IN11-0 according to the selection signal SEL3-0 and outputs the shifted signal as digital signals D11 [11:00]–D00[11:00]. The shift operation is performed in synchronization with the system clock signal SCLK. Each of the digital signals D (D11[11:00], D10[11:00], . . . , D00[11:00]) is composed of 12 bits. The shifted 12-bit digital signal is outputted to any of 12 bits of the respective digital signals D11–D00.

The OR operational part ORP is composed of a wired-OR logic not shown. Any one bit of the 12-bit digital signal D00 is outputted to any one bit of the output signal OUT11-0 by the OR operational part ORP. Any one bit of the 12-bit digital signal D01 is outputted to any one bit of the output signal OUT11-0. Similarly, in each of the digital signals D02-11, any one bit of 12 bits is outputted to any one bit of the output signal OUT11-0. Signal wiring in the OR operational part ORP is designed in such a manner that digital signals D11–D00 outputted to the output signal OUT11-0 do not conflict with each other.

Figure 4:
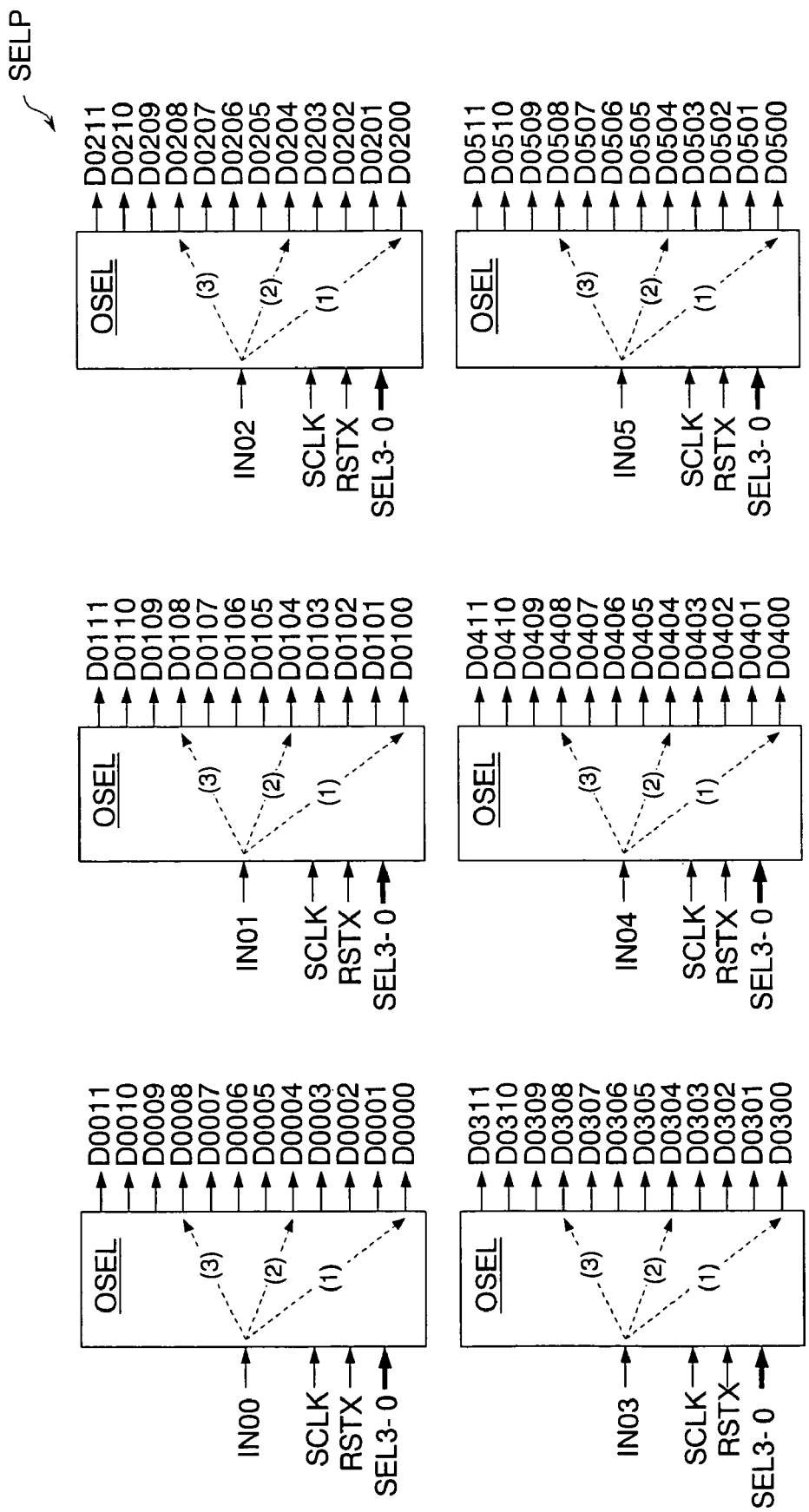
FIG. 4 is a block diagram showing details of a selection part shown in FIG. 3.
Figure 5:
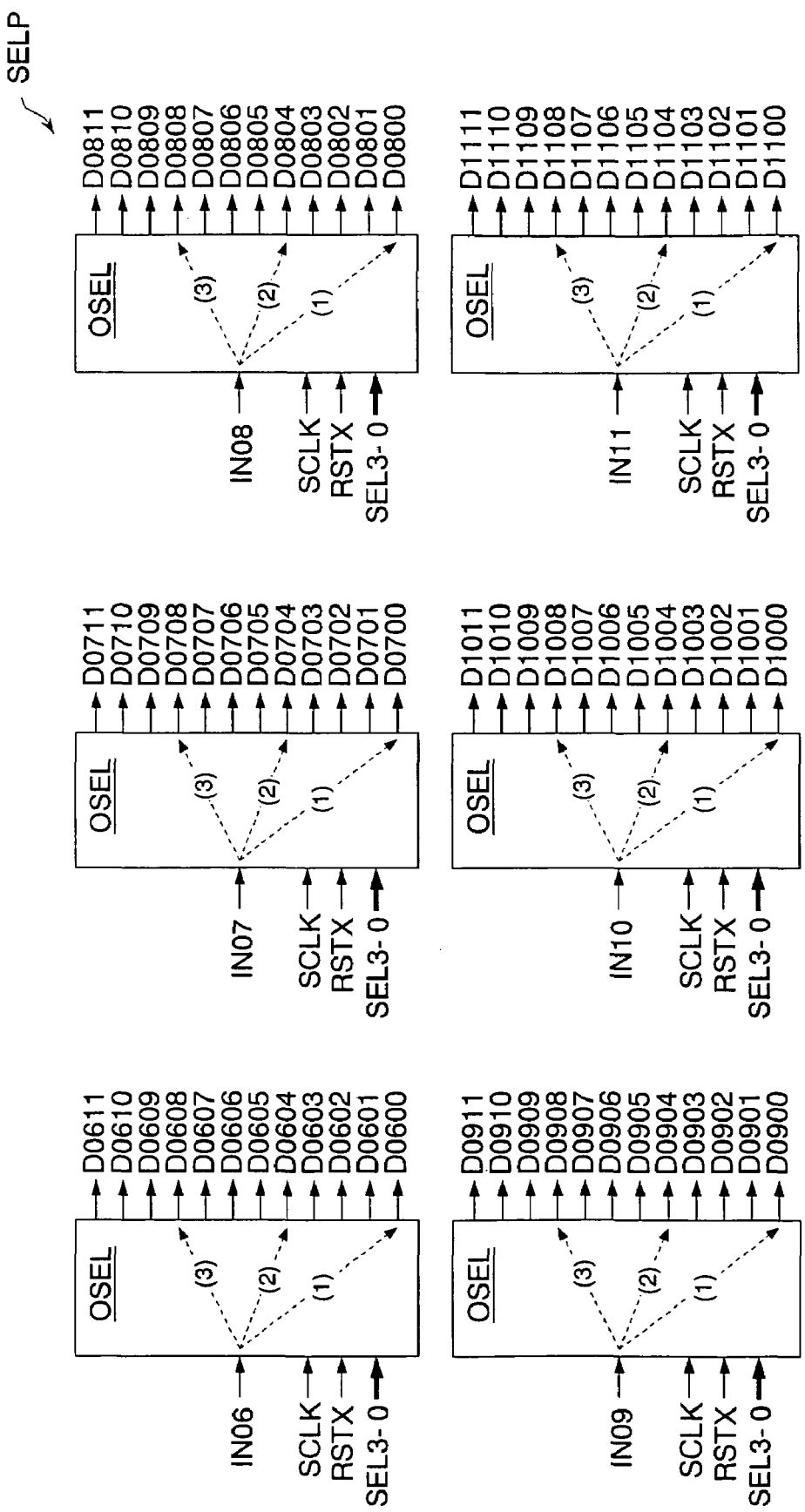
FIG. 5 is a block diagram showing the details of the selection part shown in FIG. 3.

FIG. 4 and FIG. 5 show details of the selection part SELP shown in FIG. 3. The selection part SELP includes 12 output selection circuits OSEL to output the input signal IN00-11 as the digital signals D00[11-00], D01[11-00], . . . , D11[11-00], respectively. The output selection circuits OSEL are circuits which are the same as each other.

The output selection circuit OSEL outputs the input signal IN (IN00, for example) to any of the output signal lines D (D00[11-00], for example) according to the selection signal SEL3-0. Broken-line arrows and numerals shown are used in an explanation of an operation of the switch circuit SWC given later. Each of the output selection circuits OSEL performs a shift operation in synchronization with the system clock signal SCLK and initialized in synchronization with the reset signal RSTX. Each of the output selection circuits OSEL outputs the input signal IN through a route shown by (1) by the initialization.

Figure 6:
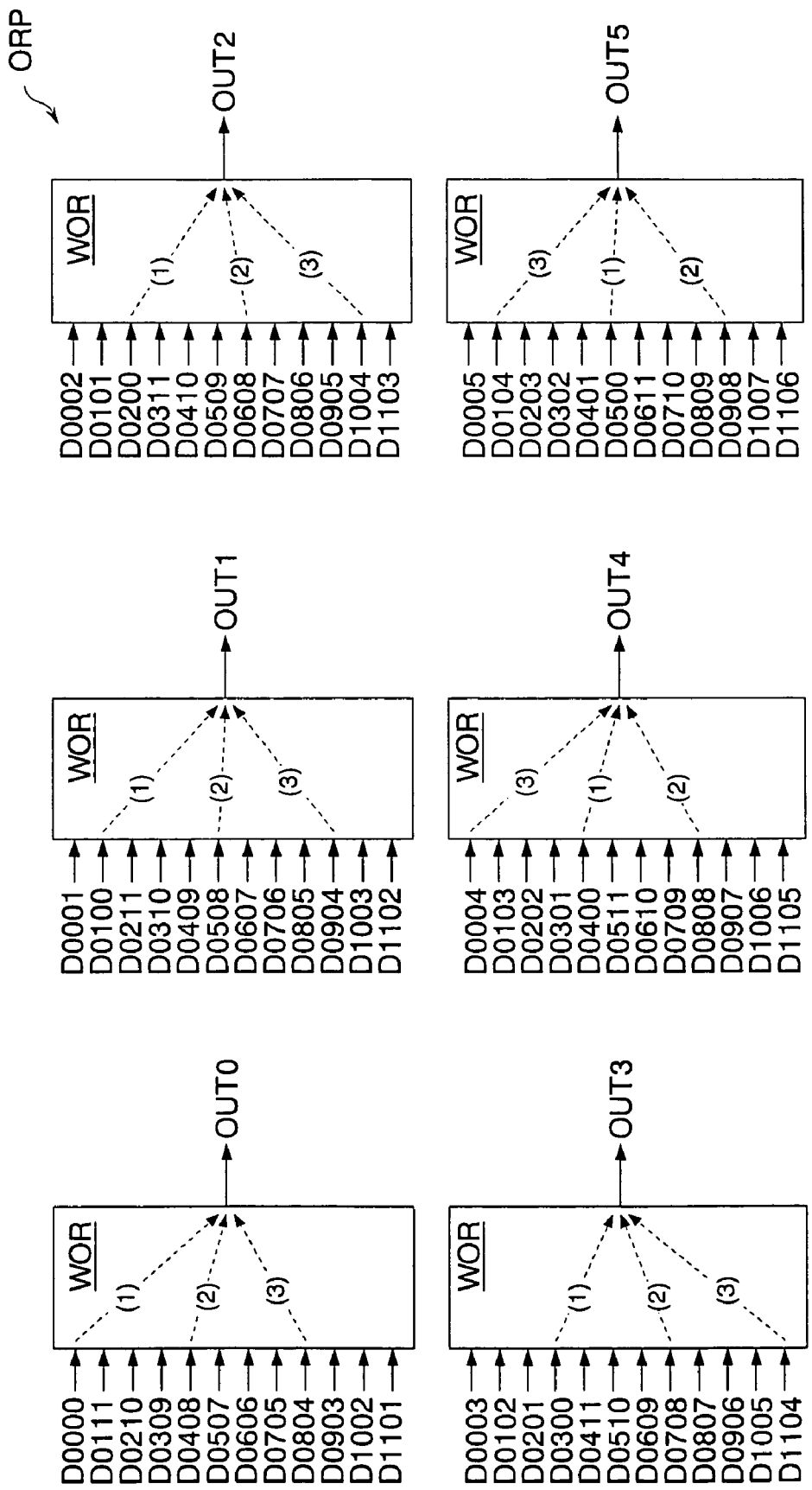
FIG. 6 is a block diagram showing details of an OR operational part shown in FIG. 3.
Figure 7:
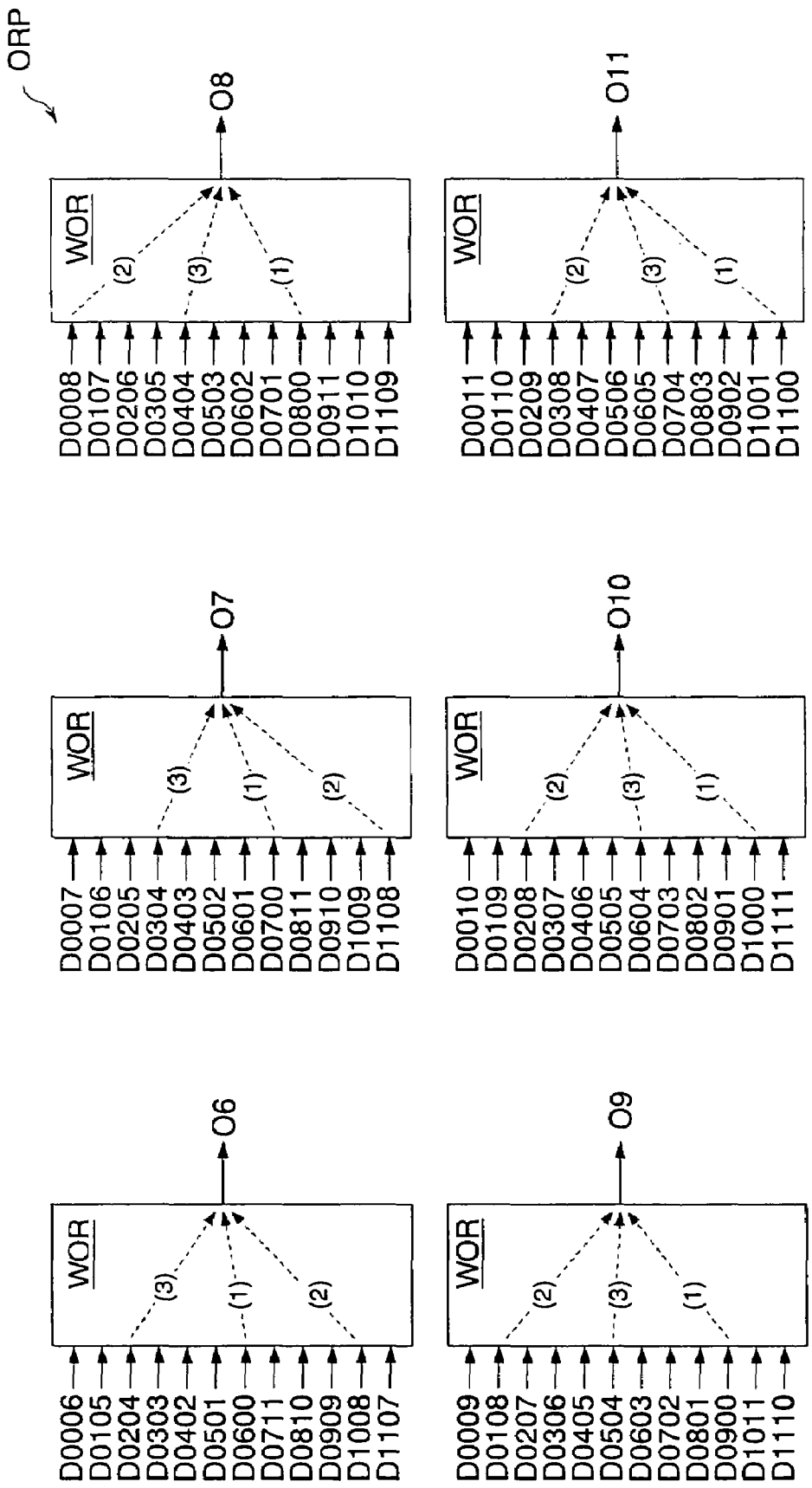
FIG. 7 is a block diagram showing the details of the OR operational part shown in FIG. 3.

FIG. 6 and FIG. 7 show details of the OR operational part ORP shown in FIG. 3. The OR operational part ORP includes 12 wired-OR circuits (operational circuits) WOR which output digital output signals to digital output signal lines OUT0-11, respectively. Here, output signal lines (D00[11-00], for example) to which each of the output selection circuits OSEL shown in FIG. 4 and FIG. 5 described above outputs an output signal are connected to the wired-OR circuits WOR different from each other.

Each of the wired-OR circuits WOR connects any of 12 digital signal lines (12 lines out of D00[11-00]–D11[11-00]) to the output signal line OUT. More specifically, each of the wired-OR circuits WOR mutually connects (shorts) 12 input terminals which receive digital signals (input signals) and outputs the digital output signal OUT. Namely, the wired-OR circuit WOR is composed of the wired-OR logic. The use of the wired-OR circuits WOR can reduce the number of elements such as a switch composed of a transistor. Consequently, the chip size of the semiconductor integrated circuit can be reduced. Broken-line arrows and numerals shown will be used in an explanation of the operation given later.

Figure 8:
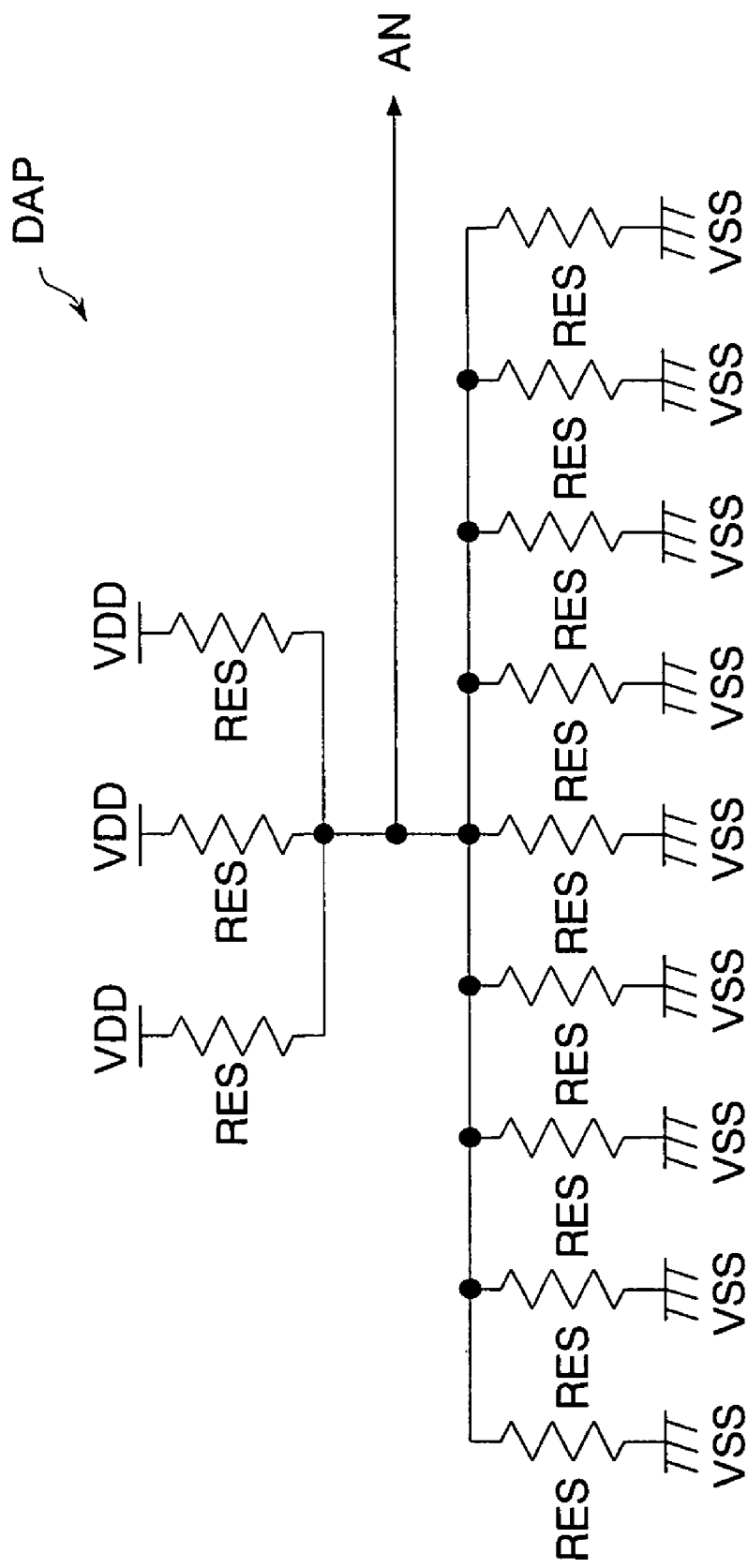
FIG. 8 is an equivalent circuit diagram showing a D/A conversion part shown in FIG. 1.
Figure 12:
FIG. 12 is an explanatory diagram showing an operation of the switch circuit.

FIG. 8 shows an equivalent circuit of the D/A conversion part DAP shown in FIG. 1. In this example, the data switching circuit DSW shown in FIG. 1 outputs 3 bits of the 12-bit digital output signal DOUT11-0 at a high logic level (power supply voltage VDD) and 9 bits thereof at a low logic level (ground voltage VSS). In this case, the analog voltage AN is found by a dividing resistance between parallel-connected three resistor elements RES and parallel-connected nine resistor elements RES. In the present invention, the resistor elements RES which receive the digital output signal DOUT11-0 are switched randomly, which makes it possible to cancel the fabricating error (dispersions) of the resistance values of the resistor elements RES, leading to an improvement in the accuracy of the D/A conversion part DAP. In other words, the bit number of the digital input signal DIN11-0 can be shifted randomly instead of a predetermined rule such as a cyclic method and outputted as the digital output signal DOUT11-0. Accordingly, D/A conversion accuracy can be improved as compared with a conventional DEM method.

FIG. 9 to FIG. 19 show operations of the switch circuit SWC when the shift signal SFT3-0 is "0000" to "1010" in binary, respectively. The values of the bit signal BIT are all set to "1011" in binary ("11" in decimal). Each figure shows that in continuous 12 clock cycles (system clock signal SCLK), to which of bits OUT11-0 of the digital output signal OUT each of bits IN11-0 of the digital input signal IN is outputted. Incidentally, the range of the change of the shift signal SFT3-0 may be "0000" to "1011" or "0001" to "1011" instead of "0000" to "1011".

As described above, the random-number control circuit RCNT changes the shift signal SFT3-0 randomly every 12 clock cycles (SCLK). Therefore, shift operations of the signal shown in FIG. 9 to FIG. 19 are sequentially executed randomly every 12 clock cycles. The operation when the shift signal SFT3-0 is "0100" will be explained below as an example using FIG. 4 to FIG. 7 and FIG. 13.

As shown by the broken-line arrows in FIG. 4 and FIG. 5, the respective output selection circuits OSEL of the selection part SELP shift output destinations of the digital input signal IN by 4 bits every cycle of the system clock signal SCLK. Numerical values shown by arrows show cycle numbers (SCLK value in FIG. 13) of the system clock signal SCLK. The output selection circuits OSEL all have the same circuit configuration. Hence, output destinations (D11[11:00]–D00[11:00]) of the digital input signal IN shown by the arrows in each clock cycle are the same in all the output selection circuits OSEL.

Incidentally, if in the fourth clock cycle in FIG. 13, the respective bits of the digital input signal IN are shifted by 4 bits with respect to the third clock cycle, the result becomes the same as the first clock cycle, so that randomness is not maintained. To prevent this, the operational part OP3 in the switch control circuit SCNT shown by FIG. 2 subtracts a number smaller than the number of bits of the digital input signal IN by "1" if the bit number exceeds the bit signal value BIT by shift. More specifically, the bit number of the digital output signal OUT to be outputted is further shifted by "1" by this operation. In FIG. 9 to FIG. 19, clock cycles in which this operation is executed are shown by thick arrows. Incidentally, in FIG. 9 and FIG. 10, this operation does not occur since the shift amount is "0" and "1".

The operation of the operational part OP3 prevents the bit number from being simply shifted cyclically. As just described, in the switch control circuit SCNT, even when the value of the selection signal SEL3-0 gets out of the bit number of the digital input signal DIN11-0, the next bit number is generated by cycling the bit number and further shifting the bit number by a predetermined value by the operational parts OP1-3. This can prevent the bit number from being repeated within 12 clock cycles. Accordingly, the digital output signal OUT is outputted more randomly.

Then, the respective wired-OR circuits WOR of the OR operational part ORP output 12 digital signals D (12 lines which do not overlap each other out of D11[11:00]–D00[11:00]) as the digital output signal OUT11-0 as shown by the broken-line arrows in FIG. 6 and FIG. 7. Numerical values shown by arrows show the cycle numbers (SCLK value in FIG. 13) of the system clock signal SCLK. In each of the wired-OR circuits WOR, the digital signal D is supplied to only one of 12 input terminals. Therefore, the OR operational part ORP does not malfunction even if it is configured by a wired-OR logic in which an input terminal is directly connected to an output terminal.

FIG. 20 shows an operation of the switch circuit SWC when the value of the bit signal is set to "0101" in binary ("5" in decimal). In this example, the shift signal SFT3-0 is "0100" in binary.

The bit signal BIT3-0 shows the range of the number of bits of the digital output signal OUT to which respective bits of the digital input signal IN are outputted (in this example, 6 numbers from "0" to "5"). Therefore, each bit of the digital input signal IN is outputted to any of 6 bits of the digital output signal OUT. For example, the bit IN0 of the digital input signal IN is outputted to any of 6 bits OUT0-5 of the digital output signal OUT as shown by half-tone dot meshing. By limiting the number of bits of the output destination of the digital signal by the bit signal BIT, the digital output signal OUT can be outputted more randomly. In particular, randomness can be improved by changing the value of the bit signal BIT during the operation of the switch circuit SWC.

As described above, in this embodiment, the bit number of the digital input signal IN can be shifted in random order without regularity and outputted as the digital output signal OUT. Accordingly, a data switching circuit DSW which switches bits of the digital input signal IN randomly can be configured. On this occasion, the shift signal corresponding to the random number is generated by the random-number generator RG, whereby the digital output signal OUT whose bit number is shifted in random order can be outputted without depending on an external system.

The digital signal OUT whose bit number is shifted in random order is supplied to the D/A conversion part DAP, and the digital signal is converted into the analog signal, so that the D/A conversion accuracy can be improved as compared with the related art in which the digital signal is cycled by a predetermined rule.

Figure 21:
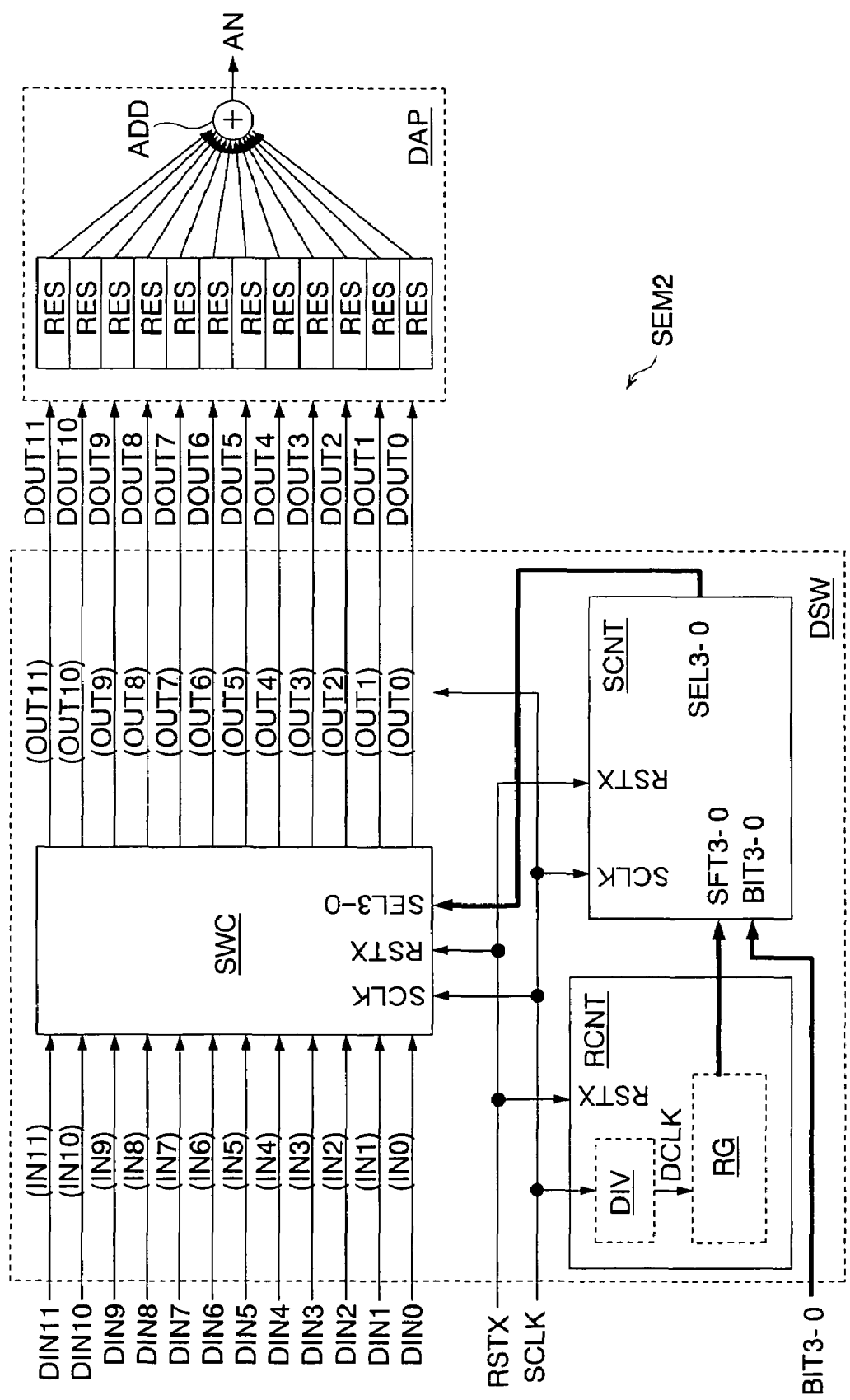
FIG. 21 is a block diagram showing a second embodiment of the semiconductor integrated circuit of the present invention.

FIG. 21 shows a second embodiment of the semiconductor integrated circuit of the present invention. The same numerals and symbols are used to designate the same elements as those explained in the first embodiment, and a detailed description thereof is omitted.

A semiconductor integrated circuit SEM2 of this embodiment is configured by omitting the first and second memory units FF1 and FF2 from the semiconductor integrated circuit SEM1 of the first embodiment. The other configuration is the same as that of the first embodiment. Even if circuits which latch the digital input signal DIN (IN) and the digital output signal DOUT (OUT) do not exist, the D/A conversion accuracy can be improved as in the first embodiment. Further, in this embodiment, by omitting the first and second memory units FF1 and FF2, the circuit scale of the semiconductor integrated circuit SEM2 is reduced, which makes a reduction in chip size possible.

Incidentally, in the above-described embodiments, the example in which the system clock signal SCLK is set to the same frequency as the clock signal CLK is described. The present invention is not limited to this example. For example, by making the frequency of the system clock signal SCLK higher than the frequency of the clock signal CLK, the present invention can also be applied to an oversampling D/A converter. In this case, the system clock signal SCLK is generated, for example, by dividing the frequency of the clock signal CLK, and the phases of the signals SCLK and CLK are equal to each other.

In the above-described embodiments, the example in which the present invention is applied to the D/A converter is described. The present invention is not limited to this example, but is applicable to a data switching circuit (data transfer circuit) which randomly shifts and outputs respective bits of a digital input signal.

In the above-described embodiments, the example in which the numbers of bits of the digital input signal DIN and the digital output signal DOUT are both 12 bits is described. However, the number of bits of the digital output signal DOUT may be smaller then the number of bits of the digital input signal DIN.

In the above-described embodiments, the example in which the random number is generated every 12 clock cycles of the system clock signal SCLK to change the shift signal SFT is described. However, the frequency of change of the shift signal SFT may be shorter or longer than 12 clock cycles. For example, the shift signal SFT may be changed every 1 clock cycle. Further, the shift signal SFT may be supplied from outside the semiconductor integrated circuit without the random-number control circuit RCNT being formed.

In the above-described embodiments, the example in which the selection signal SEL3-0 is generated by sequentially adding the value indicated by the shift signal SFT to the bit number in response to each system clock signal SCLK is described. However, the selection signal SEL3-0 may be generated by sequentially subtracting the value indicated by the shift signal SFT from the bit number in response to each system clock signal SCLK.

Figure 22:
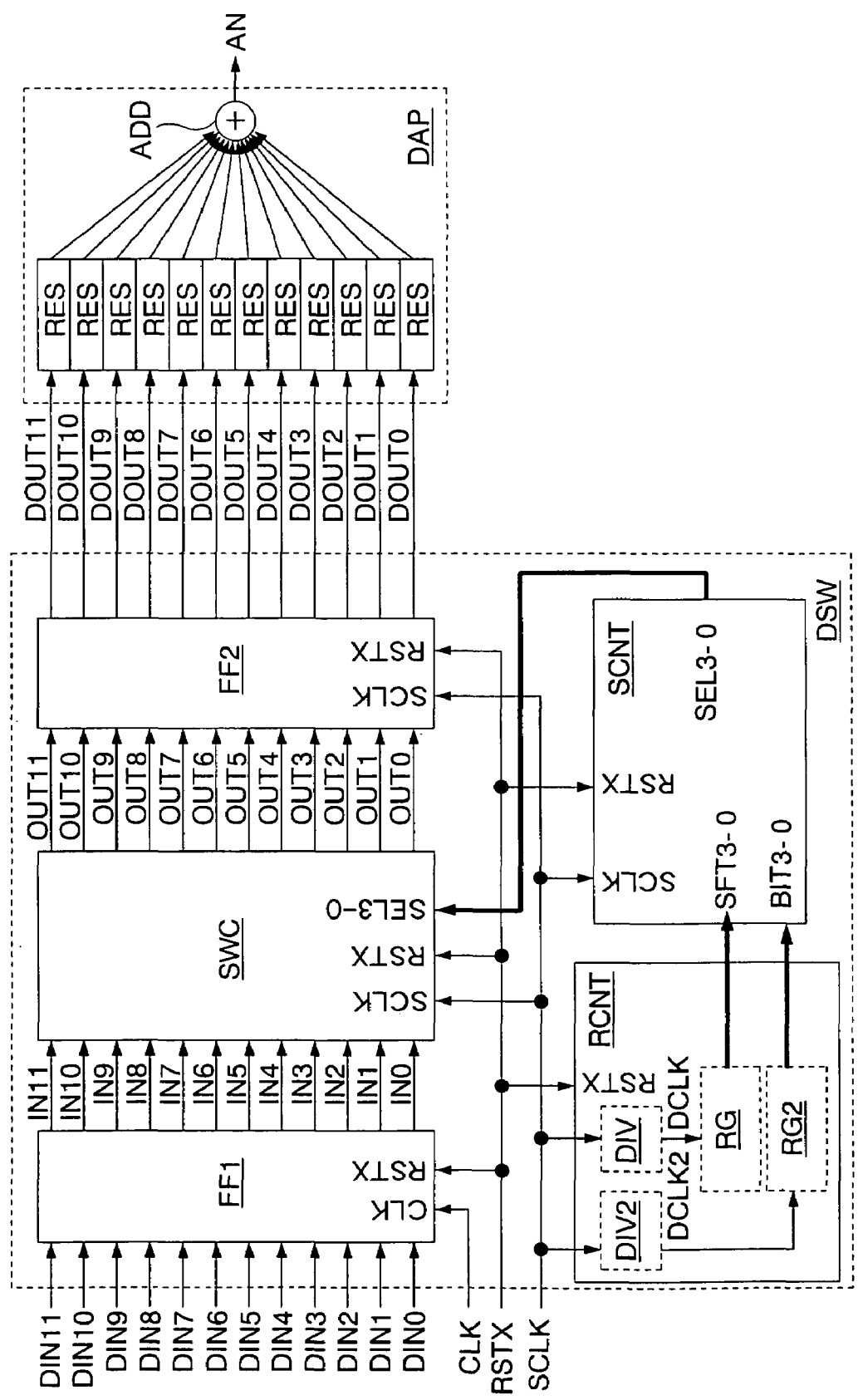
FIG. 22 is a block diagram showing another example of the semiconductor integrated circuit.

In the above-described embodiments, the example in which the bit signal BIT is received from outside the semiconductor integrated circuit is described. However, for example, as shown in FIG. 22, a random-number generator RG2 (bit signal generator) which generates the bit signal BIT randomly may be formed inside the semiconductor integrated circuit. For example, the random-number generator RG2 generates a random number in synchronization with a divided clock signal DLCK2 obtained by dividing the frequency of the system clock signal SCLK by a frequency divider DIV2. In this case, the number of bits of a destination of the digital signal can be changed randomly, and thereby the digital output signal OUT which is more random can be outputted.

In the above-described embodiments, the example in which the D/A conversion part DAP is configured using plural resistor elements RES is described. The D/A conversion part DAP may be configured using plural capacitor elements.

The invention is not limited to the above embodiments and various modifications may be made without departing from the spirit and scope of the invention. Any improvement may be made in part or all of the components.

What is claimed is:

1. A semiconductor integrated circuit, comprising:
   a switch circuit which receives a selection signal indicating a bit number, sequentially shifts a bit number of a plural-bit digital input signal supplied to plural input signal lines according to said selection signal, and sequentially outputs the shifted digital signal as a plural-bit digital output signal to plural output signal lines; and
   a switch control circuit which receives a shift signal whose value varies to a random value in predetermined cycles, sequentially generates a next bit number by performing operations a plurality of times on said bit number and a value indicated by said shift signal during a single cycle, and sequentially outputs the generated bit number as said selection signal.

2. The semiconductor integrated circuit according to claim 1, further comprising
   a random-number control circuit which includes a random-number generator and outputs said shift signal corresponding to a random number generated by said random-number generator.

3. The semiconductor integrated circuit according to claim 2, wherein:
   said switch circuit outputs said digital output signal in synchronization with a first clock signal; and
   said random-number generator generates the random number in synchronization with a clock signal whose frequency is lower than that of the first clock signal.

4. The semiconductor integrated circuit according to claim 1, wherein
   said switch control circuit receives a bit signal indicating a number of bits and sets, according to the received bit signal, a range of a number of bits of said digital output signal to which respective bits of said digital input signal are outputted.

5. The semiconductor integrated circuit according to claim 4, further comprising
   a bit signal generator which generates said bit signal which is random.

6. The semiconductor integrated circuit according to claim 1, further comprising:
   a first memory unit which holds a value of said digital input signal and outputs the holding digital input signal to said switch circuit via said input signal lines; and
   a second memory unit which holds a value of said digital output signal outputted from said switch circuit and outputs the holding digital output signal.

7. The semiconductor integrated circuit according to claim 6, wherein:
   said switch circuit outputs said digital output signal in synchronization with a first clock signal;
   said second memory unit holds said digital output signal in synchronization with said first clock signal;
   said first memory unit receives said digital input signal in synchronization with a second clock signal; and
   frequencies of said first and second clock signals are the same.

8. The semiconductor integrated circuit according to claim 6, wherein:
   said switch circuit outputs said digital output signal in synchronization with a first clock signal;
   said second memory unit holds said digital output signal in synchronization with said first clock signal;
   said first memory unit receives said digital input signal in synchronization with a second clock signal; and
   a frequency of said first clock signal is higher than a frequency of said second clock signal.

9. The semiconductor integrated circuit according to claim 1, further comprising
   an D/A conversion part which is connected to said output signal lines and converts said digital output signal from said switch circuit into an analog signal, the digital output signal being transmitted to said output signal lines.

10. The semiconductor integrated circuit according to claim 9, wherein said D/A conversion part comprises:
    plural resistor elements with one ends connected to said output signal lines respectively; and
    an adder which is connected to the other ends of said resistor elements and generates an analog voltage according to currents flowing through said resistor elements.

11. The semiconductor integrated circuit according to claim 1, wherein:
    said switch circuit comprises plural output selection circuits corresponding to respective bits of said digital input signal and plural operational circuits corresponding to respective bits of said digital output signal;
    each of said output selection circuits includes plural output signal lines respectively connected to inputs of said operational circuits and outputs respective bits of the received digital input signal to any of said output signal lines according to said shift signal;
    said output signal lines to which said output selection circuit outputs said digital output signal are connected to said operational circuits different from each other; and
    each of said operational circuits outputs an OR logic of said output signal lines as said digital output signal.

12. The semiconductor integrated circuit according to claim 11, wherein
    each of said operational circuits is configured by a wired-OR logic.

13. The semiconductor integrated circuit according to claim 1, wherein
    when a bit number to generate is outside the bit numbers composing said digital input signal, said switch control circuit generates a next bit number by cycling the bit number and then shifting the bit number by a predetermined value.

* * * * *